US010876227B2

(12) United States Patent
Harrison et al.

(10) Patent No.: US 10,876,227 B2
(45) Date of Patent: Dec. 29, 2020

(54) FIBER WITH ELEMENTAL ADDITIVE(S) AND METHOD OF MAKING

(71) Applicant: FREE FORM FIBERS, LLC, Saratoga Springs, NY (US)

(72) Inventors: Shay L. Harrison, East Schodack, NY (US); Joseph Pegna, Saratoga Springs, NY (US); Erik G. Vaaler, Redwood City, CA (US); Ram K. Goduguchinta, Ballston Lake, NY (US); Kirk L. Williams, Saratoga Springs, NY (US); John L. Schneiter, Cohoes, NY (US)

(73) Assignee: FREE FORM FIBERS, LLC, Saratoga Springs, NY (US)

( * ) Notice: Subject to any disclaimer, the term of this patent is extended or adjusted under 35 U.S.C. 154(b) by 28 days.

(21) Appl. No.: 15/825,664

(22) Filed: Nov. 29, 2017

(65) Prior Publication Data
US 2018/0148864 A1    May 31, 2018

Related U.S. Application Data

(60) Provisional application No. 62/427,362, filed on Nov. 29, 2016.

(51) Int. Cl.
*D01F 9/00*     (2006.01)
*D01F 11/12*    (2006.01)
(Continued)

(52) U.S. Cl.
CPC ........ *D01F 11/127* (2013.01); *C01B 21/0761* (2013.01); *C01B 32/914* (2017.08);
(Continued)

(58) Field of Classification Search
CPC . D01F 9/00; D01F 9/08; D01F 11/127; C04B 2235/665; C04B 2305/40;
(Continued)

(56) References Cited

U.S. PATENT DOCUMENTS 5,134,020 A    7/1992  Cotteret et al.
5,378,665 A    1/1995  Chen et al.
(Continued)

FOREIGN PATENT DOCUMENTS

EP    1 209 123 A2    5/2009
EP    3 519 372       12/2015
(Continued)

OTHER PUBLICATIONS

Johansson et al., "Microfabrication of Three-Dimensional Boron Structures by Laser Chemical Processing", J. Appl. Phys., vol. 72 (12), Dec. 19, 1992 (8 pages).
(Continued)

*Primary Examiner* — Matthew D Matzek
(74) *Attorney, Agent, or Firm* — Kevin P. Radigan, Esq.; Heslin Rothenberg Farley & Mesiti P.C.

(57) ABSTRACT

A multi-composition fiber is provided including a primary fiber material and an elemental additive material deposited on grain boundaries between adjacent crystalline domains of the primary fiber material. A method of making a multi-composition fiber is also provided, which includes providing a precursor laden environment, and promoting fiber growth using laser heating. The precursor laden environment includes a primary precursor material and an elemental precursor material.

7 Claims, 6 Drawing Sheets

(51) Int. Cl.
| | |
|---|---|
| *D01F 9/08* | (2006.01) |
| *C04B 35/622* | (2006.01) |
| *D01D 5/20* | (2006.01) |
| *C01B 32/956* | (2017.01) |
| *D01F 1/10* | (2006.01) |
| *C23C 16/44* | (2006.01) |
| *C01B 32/914* | (2017.01) |
| *C01B 21/076* | (2006.01) |
| *C01B 35/04* | (2006.01) |
| *C23C 16/48* | (2006.01) |
| *H01S 3/067* | (2006.01) |

(52) U.S. Cl.
CPC ............ *C01B 32/956* (2017.08); *C01B 35/04* (2013.01); *C04B 35/6229* (2013.01); *C04B 35/62272* (2013.01); *C04B 35/62277* (2013.01); *C04B 35/62281* (2013.01); *C04B 35/62286* (2013.01); *C04B 35/62295* (2013.01); *C23C 16/4418* (2013.01); *C23C 16/483* (2013.01); *D01D 5/20* (2013.01); *D01F 1/10* (2013.01); *D01F 9/08* (2013.01); *H01S 3/06737* (2013.01); *C04B 2235/40* (2013.01); *C04B 2235/404* (2013.01); *C04B 2235/5264* (2013.01); *C04B 2235/665* (2013.01); *C04B 2235/85* (2013.01)

(58) Field of Classification Search
CPC ........ C04B 2305/404; C04B 35/62233; C04B 35/62272; C04B 35/62227
USPC .................................. 428/357, 364, 373, 374
See application file for complete search history.

(56) References Cited

U.S. PATENT DOCUMENTS

| | | | |
|---|---|---|---|
| 5,399,430 A | 3/1995 | Nordine | |
| 5,786,023 A | 7/1998 | Maxwell et al. | |
| 5,955,391 A | 9/1999 | Kameda et al. | |
| 6,291,058 B1 | 9/2001 | Goujard et al. | |
| 7,888,475 B2 | 2/2011 | Padgett et al. | |
| 2002/0085968 A1 | 7/2002 | Smalley et al. | |
| 2005/0181192 A1 | 8/2005 | Steffier | |
| 2005/0255033 A1 | 11/2005 | Shimoji et al. | |
| 2006/0275537 A1* | 12/2006 | Maxwell ............... | C23C 16/047 427/8 |
| 2010/0055352 A1 | 3/2010 | Maxwell | |
| 2011/0170653 A1 | 7/2011 | Cabrero et al. | |
| 2012/0076718 A1 | 3/2012 | Liu et al. | |
| 2013/0010915 A1 | 1/2013 | Garnier et al. | |
| 2013/0077731 A1 | 3/2013 | Sherwood et al. | |
| 2013/0163711 A1 | 6/2013 | Zabiego et al. | |
| 2013/0236153 A1 | 9/2013 | Rochette et al. | |
| 2015/0004393 A1 | 1/2015 | Pegna et al. | |
| 2016/0215417 A1 | 7/2016 | Schneiter et al. | |
| 2016/0237595 A1 | 8/2016 | Maxwell et al. | |
| 2016/0347672 A1 | 12/2016 | Harrison et al. | |
| 2017/0213604 A1 | 7/2017 | Pegna et al. | |
| 2017/0326838 A1 | 11/2017 | Pegna et al. | |
| 2017/0331022 A1 | 11/2017 | Pegna et al. | |

FOREIGN PATENT DOCUMENTS

| | | |
|---|---|---|
| JP | 61-132628 A | 6/1986 |
| JP | 09-268065 A | 10/1997 |
| WO | WO 2012/109841 A1 | 8/2012 |
| WO | WO 2013/180764 A1 | 12/2013 |
| WO | WO 2015/112935 A1 | 7/2015 |
| WO | WO-2015112935 A1 * | 7/2015 |
| WO | WO 2015/200257 A1 | 12/2015 |
| WO | WO 2016/073504 A1 | 5/2016 |

OTHER PUBLICATIONS

Wallenberger, Frederick T., "Inorganic Fibres and Microfabricated Parts by Laser Assisted Chemical Vapour Deposition (LCVD): Structures and Properties*", Ceramics International, 23 (1997) (8 pages).
Maxwell et al., "Real-Time Volumetric Growth Rate Measurements and Feedback Control of Three-Dimensional Laser Chemical Vapor Deposition)", Appl. Phys. A, vol. 67, No. 3, 1998 (7 pages).
Wen et al., "Interfacial Microstructure and Reaction of BN-Coated Single Crystal Al2O3 Fiber Reinforced NiAl Matrix Composites", Journal of Materials Science, vol. 37, No. 6, Mar. 1, 2002 (pp. 1253-1258).
Kerans, Ronald J., "High Temperature Composites", Air Force Research Laboratory Report No. AFRL-ML-WL-TP-2002-407, Aug. 2002 (22 pages).
Behlau et al., "Mechanical Properties of Carbon and BN Coated SiC Fibers", Ceramic Engineering and Science Proceedings, vol. 24, No. 4, Jan. 1, 2003 (pp. 225-230).
Chen et al., "Carbide Derived Carbon (CDC) Coatings for Tyranno ZMI SiC Fibers", Ceramic Engineering and Science Proceedings, vol. 24, No. 3, Jan. 26, 2003 (pp. 57-62).
Chen et al., "Carbothermal Synthesis of Al—O—N Coatings Increasing Strength of SiC Fibers", International Journal of Applied Ceramic Technology, vol. 1, No. 1, Jan. 1, 2004 (pp. 68-75).
Longtin et al., "Systhesis of Carbon Nanofiber Films and Nanofiber Composite Coatings by Laser-Assisted Catalytic Chemical Vapor Deposition", Thin Solid Films, vol. 515 (2007) pp. 2958-2964.
Hu et al., "Oxidation Behavior of Zirconium Diboride-Silicon Carbide at 1800°C", Scripta Materialia, vol. 57, No. 9, Nov. 2007 (pp. 825-828).
Longtin et al., "Selective Area Synthesis of Aligned Carbon Nanofibers by Laser-Assisted Catalytic Chemical Vapor Deposition", Diamond and Related Materials, vol. 16 (2007) pp. 1541-1549.
Marsh, John H., "Quantum Well Intermixing Revolutionizes High Power Laser Diodes", Diodenlaser, LTJ No. 5, 4:32-35, doi:10.1002/latj.200790190 (Nov. 2007) (4 pages).
Liu et al., "Monolithic Integration of Sampled Grating CBR with Electroabsorption Modulator by Combining Selective-Area-Growth MOCVD and Quantum-Well Intermixing", Chinese Physics Letters, vol. 25, No. 10, Oct. 1, 2008 (pp. 3670-3672).
Jouanny et al., "Study of TiC Coatings on Nicalon Fibre Prepared by Pressure-Pulsed Reactive Chemical Vapor Deposition at Low Pressure", ECS Translations, vol. 25, No. 8, Jan. 1, 2009 (pp. 1267-1272).
International Search Report & Written Opinion for PCT Application No. PCT/US2013/022053, filed Jan. 18, 2013 (PCT Publication No. WO 2013/180764 A1), dated Nov. 1, 2013 (15 pages).
Glazoff et al., "Morphological Analysis of Zirconium Nuclear Fuel Rods Braided with SiC: Qality Assurance and Defect Identification", Journal of Nuclear Materials, 451.1 (Apr. 12, 2014) (pp. 216-224).
Wang et al., "Synthesis of ZrC-SiC Powders from Hybrid Liquid Precursors with Improved Oxidation Resistance", Journal of the American Ceramic Society, vol. 98, No. 1, Jan. 2015 (pp. 197-204).
Pegna et al., International Search Report & Written Opinion for PCT/US2015/037080 (PCT Publication No. WO 2015/200257 A1), dated Oct. 23, 2015 (10 pages).
Pegna et al., Communication and Extended European Search Report (EESR) for EP Application No. 13796908.5, dated Feb. 9, 2016 (20 pages).
Pegna et al., "Nanofiber-Coated Fiber and Methods of Making", U.S. Appl. No. 15/631,243, filed Jun. 23, 2017 (29 pages).
Harrison et al., "Multi-Composition Fiber with Refractory Additive(s) and Method of Making", U.S. Appl. No. 15/718,199, filed Sep. 28, 2017 (28 pages).
Harrison et al., "Refractory Oxide Coated Fiber and Method of Making", U.S. Appl. No. 15/718,206, filed Sep. 28, 2017 (29 pages).

* cited by examiner

FIBER WITH ELEMENTAL ADDITIVE(S) AND METHOD OF MAKING

CROSS-REFERENCE TO RELATED APPLICATION

This application claims the benefit of U.S. provisional patent application Ser. No. 62/427,362, filed Nov. 29, 2016, entitled "Fiber with Elemental Additives and Method of Making", which is hereby incorporated herein by reference in its entirety.

BACKGROUND

The present invention relates generally to the field of fibers for reinforcing materials and more specifically to the field of fibers having elemental additives.

In a wide variety of applications, fiber composite materials, incorporating fibers into a surrounding material matrix, provide higher structural performance than traditional, bulk (i.e., non-fiber-reinforced) materials. Unfortunately, however, conventionally-produced, single-composition fibers often suffer from poor creep resistance at elevated temperatures due to diffusion-driven grain growth increasing the average grain size by, in some cases, more than two orders of magnitude.

SUMMARY

As described herein, the above-noted grain growth process often proceeds by atomic diffusion through grain boundary paths, and therefore, the addition of oversized atoms (i.e., one or more elemental additives) at grain boundaries presents an energy barrier to atomic diffusion and thus increases creep resistance by slowing down grain growth at elevated temperatures in the formed fiber. Opportunities exist, therefore, to improve fiber creep resistance performance by providing a multi-composition fiber with elemental additives.

The opportunities described above are addressed, in one aspect of the present invention, by a multi-composition fiber comprising a primary fiber material and an elemental additive material deposited on grain boundaries between adjacent crystalline domains of the primary fiber material. In another aspect of the present invention, a method of making a multi-composition fiber is provided, which comprises providing a precursor laden environment and promoting fiber growth using laser heating, the precursor laden environment comprising a primary precursor material and an elemental precursor material.

Additional features and advantages are realized through the techniques of the present invention. Other embodiments and aspects of the invention are described in detail herein and are considered a part of the claimed invention.

BRIEF DESCRIPTION OF THE DRAWINGS

These and other features, aspects, and advantages of the present invention will become better understood when the following detailed description is read with reference to the accompanying drawings in which like characters represent like parts throughout the drawings, and wherein.

DETAILED DESCRIPTION

Figure 1:
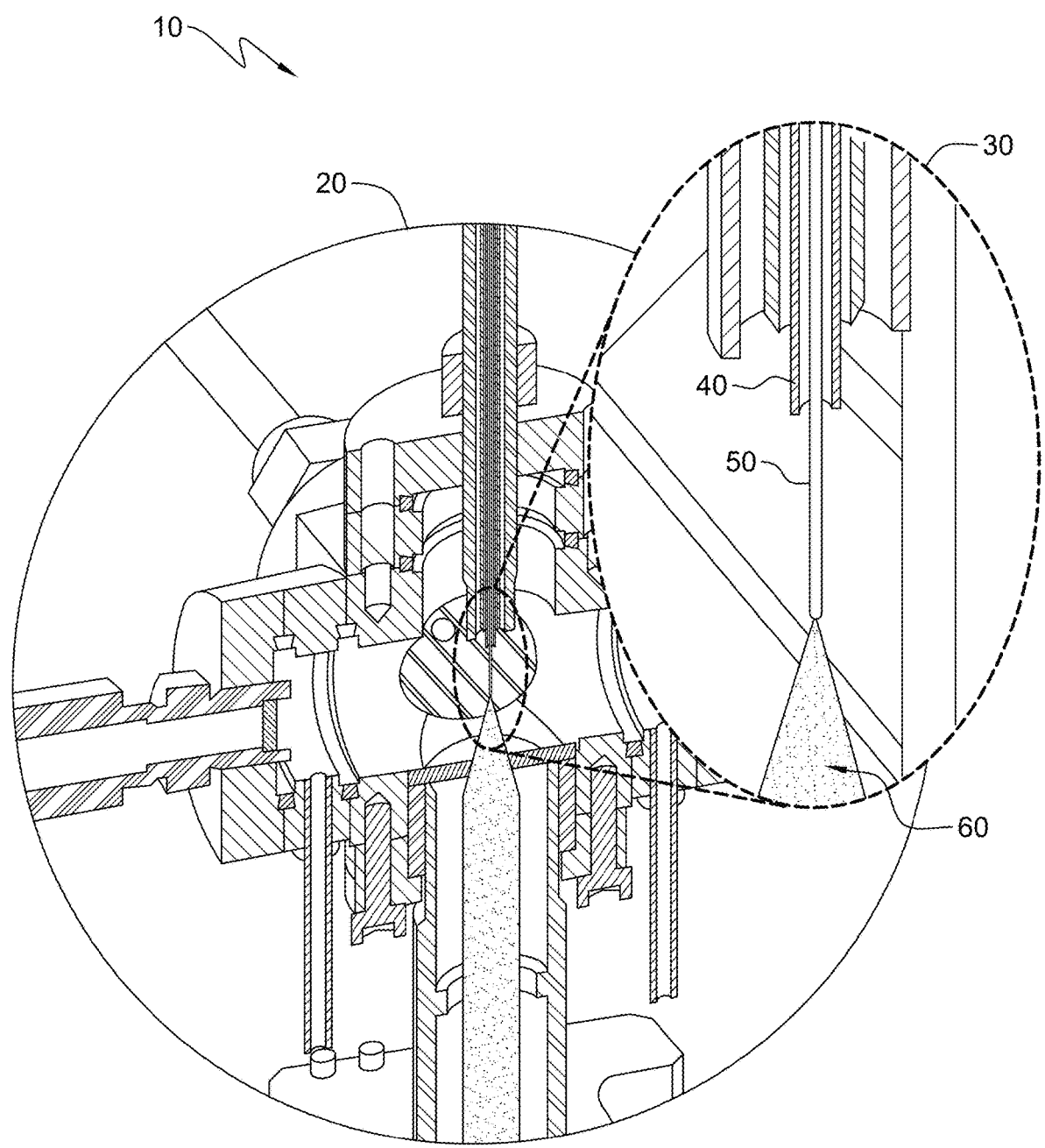
FIG. 1 is a schematic representation of a single-fiber reactor, showing a seed fiber substrate, a reactor cube into which precursor gases are delivered, a focused laser beam impinging on the seed fiber, and reactor windows that are transparent to the incoming laser beam wavelength and allow for, for instance, video monitoring of the process, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, fabrication and processing techniques, etc., are omitted so as to not unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application, for instance, for facilitating providing multi-composition fibers with elemental additive(s) and methods of making, as described herein.

Before describing the above-noted aspects further, note that the present invention incorporates or utilizes the following, alone or in any combination, and/or in combination with the subject matter of commonly assigned, International Patent Application No. PCT/US2015/037080, which published on Dec. 30, 2015, as PCT Patent Publication No. WO 2015/200257 A1, and with commonly assigned, U.S. patent application Ser. No. 15/114,504, filed Jul. 27, 2016, entitled: Contiguously Blended Nano-Scaled Multi-Phase Fibers", which published on Dec. 1, 2016, as U.S. Patent Publication No. 2016/0347672 A1, and with commonly assigned, U.S. patent application Ser. No. 15/320,800, filed Dec. 21, 2016, entitled "An Additive Manufacturing Technology for the Fabrication and Characterization of Nuclear Reactor Fuel", which published on Jul. 27, 2017, as U.S. Patent Publication No. 2017/0213604 A1, and with commonly assigned, U.S. patent application Ser. No. 15/592,408, filed May 11, 2017, entitled "Fiber Delivery Assembly and Method of Making", and with commonly assigned, U.S. patent application Ser. No. 15/592,726, filed May 11, 2017, entitled "Multilayer Functional Fiber and Method of Making", and with commonly assigned, U.S. patent application Ser. No. 15/631,243, filed Jun. 23, 2017, entitled "Nanofiber-Coated Fiber and Methods of Making", and with commonly assigned, U.S. patent application Ser. No. 15/718,199, filed Sep. 28, 2017, entitled "Multi-Composition Fiber with Refractory Additive(s) and Method of Making", and with commonly assigned U.S. patent application Ser. No. 15/718,206, filed Sep. 28, 2017, entitled "Refractory Oxide Coated Fiber and Method of Making", each of which is hereby incorporated herein by reference in its entirety.

Fiber-reinforced composite materials are designed to concomitantly maximize strength and minimize weight. This is achieved by embedding high-strength low-density fibers into a low-density filler matrix in such a way that fibers channel and carry the structural stresses in composite structures. The matrix serves as a glue that holds fibers together and helps transfer loads in shear from fiber to fiber, but in fact the matrix material is not a structural element and carries but a fraction of the overall structural load seen by a composite material.

Composites are thus engineered materials made up of a network of reinforcing fibers—sometimes woven, knitted or braided—held together by a matrix. Fibers are usually packaged as twisted multifilament yarns called "tows". The matrix gives rise to three self-explanatory classes of composite materials: (1) Polymer Matrix Composites (PMCs), sometimes-called Organic Matrix Composites (OMCs); (2) Metal Matrix Composites (MMC's); and (3) Ceramic Matrix Composites (CMCs).

Such an approach to composite materials in which the tows are but a disorganized bundle of entangled filaments constrains the fibers to a purely structural role. A new approach to the fabrication of multilayered fibers called 1½-D printing allows for the formation of evenly spaced, parallel filaments. Together, this construct constitutes an arbitrary long ribbon of continuous filaments that allow the fiber to break out of their purely structural functions, and enable sweeping new designs in which the fibers contain embedded microsystems. This is described further in the above-referenced, commonly assigned, U.S. patent application Ser. No. 15/592,408.

This approach to fiber manufacturing has been proposed for example as a means to produce TRISO-inspired nuclear fuel embedded within fibers for subsequent embedding into a refractory matrix to form an accident tolerant CMC nuclear fuel, such as described in the above-referenced, commonly assigned PCT Patent Publication No. WO 2015/200257 A1. However, this is but one instance of possible new designs enabled by this technology.

At its core, 1½-D printing rests on the physical principles of Laser Induced Chemical Vapor Deposition to both print continuous filaments and deposit patterns coated onto the fiber. Commonly assigned, U.S. patent application Ser. No. 14/372,085, filed Jul. 14, 2014, entitled "High Strength Ceramic Fibers and Methods of Fabrication", which published on Jan. 1, 2015, as U.S. Patent Publication No. 2015/0004393 A1, teaches how arrays of filaments can be laser-printed, with diameters potentially varying along their length. The above-referenced, PCT Patent Publication No. WO 2015/200257 A1 teaches how a laser incident to the ribbon can be used to write a pattern of coatings onto a substrate fiber by turning the laser on or off as the ribbon advances. It also teaches that coating thickness can be adjusted. Finally, the above-referenced, commonly assigned U.S. patent application Ser. No. 15/592,408, teaches how such ribbons of parallel filaments can be collected as ribbons onto a tape to enhance fiber volume fraction in the composite.

To implement 1½-D printing, Laser Induced Chemical Vapor Deposition (LCVD) was chosen as the fundamental Additive Manufacturing (AM) tool for its near material independence—an extremely rare property for AM processes. Such a process is said to be "Material Agnostic". LCVD is a technique derived from CVD, used intensively in the microelectronics fabrication industry (aka "Chip Fab"). CVD builds up electronics-grade high-purity solid deposits from a gas precursor. In its 75+ year history, Chip Fab has accumulated an impressive library of chemical precursors for a wide range of materials, numbering in the 10's of thousands. The main difference between CVD and LCVD resides in dimensionality and mass throughput. CVD is intended for 2-D film growth whereas LCVD is ideally suited for one-dimensional filamentary structures. The dimensionality difference means that deposition mechanisms are greatly enhanced for LCVD vs. CVD, leading to deposited mass fluxes (kg/m2 s) that are 3 to 9 orders of magnitude greater. For example, diamond-like carbon filaments have been measured at linear growth rates upwards of 13 cm/s, which represents a 9 order of magnitude increase in mass flux compared to thin film CVD of the same material. Finally, LCVD is essentially containerless, which virtually eliminates opportunities for material contamination by container or tool.

The following fundamental properties formally defines "1½-D Printing" AM

Material-agnostic ability to grow filaments.

Ability to vary diameter along the length of the filament, as illustrated in FIG. 10 of Pegna et al. (PCT Publication No. WO 2015/200257 A1).

Material-agnostic ability to vary composition along the length of the filament, as was demonstrated by Maxwell et al.

Material-agnostic ability to coat specific sections of filaments with a desired material, morphology and thickness; as illustrated by the nanoporous and other spot coatings shown in FIG. 11 of the above-referenced Pegna et al., PCT publication.

Disclosed herein, in part, is the concept of avoiding the use of polymeric precursors altogether by using laser-assisted chemical vapor deposition (LCVD) as is described in U.S. Pat. No. 5,786,023, entitled "Method and Apparatus for the Freeform Growth of Three-Dimensional Structures Using Pressurized Precursor Flows and Growth Rate Control", by Maxwell and Pegna, the entirety of which is hereby incorporated by reference herein. In this process pure precursor gases (such as silane and ethylene in the case of SiC fiber production) are introduced into a reactor within which a suitable substrate such as glassy carbon is positioned, and laser light is focused onto the substrate. The heat generated by the focused laser beam breaks down the precursor gases locally, and the atomic species deposit onto the substrate surface and build up locally to form a fiber. If either the laser or the substrate is pulled away from this growth zone at the growth rate a continuous fiber filament will be produced with the very high purity of the starting gases. With this technique there are virtually no unwanted impurities, and in particular no performance-robbing oxygen.

Very pure fibers can be produced using LCVD, such as silicon carbide, boron carbide, silicon nitride and others. The inventors have discovered that if a material has been deposited using CVD, there is a good chance that fiber can be produced using LCVD. Unlike with liquid polymeric precursors, however, where the chemistry can be very involved and complicated even for relatively 'simple' materials such as those mentioned above, LCVD can also be used quite directly to produce novel mixes of solid phases of different materials that either cannot be made or have not been attempted using polymeric precursor and spinneret technology. Examples include fibers composed of silicon, carbon and nitrogen contributed by the precursor gases such as silane, ethylene and ammonia, respectively, where the resulting "composite" fiber contains tightly integrated phases of silicon carbide, silicon nitride and silicon carbonitrides depending on the relative concentrations of precursor gases in the reactor. Such new and unique fibers can exhibit very useful properties such as high temperature resistance, high strength and good creep resistance at low relative cost.

FIG. 1 shows a LCVD reactor into which a substrate seed fiber has been introduced, onto the tip of which a laser beam is focused. (It will be seen that the substrate may be any solid surface capable of being heated by the laser beam. It will further be seen that multiple lasers could be used simultaneously to produce multiple simultaneous fibers as is taught in International Patent Application Serial No. PCT/US2013/022053, which published on Dec. 5, 2013, as PCT Patent Publication No. WO 2013/180764 A1, and in U.S. Patent Publication No. 2015/0004393, the entireties of which are hereby incorporated by reference herein. In accordance with that Application, FIG. 1 more particularly shows a reactor 10; enlarged cutout view of reactor chamber 20; enlarged view of growth region 30. A self-seeded fiber 50 grows towards an oncoming coaxial laser 60 and is extracted through an extrusion microtube 40.

A mixture of precursor gases can be introduced at a desired relative partial pressure ratio and total pressure. The laser is turned on, generating a hot spot on the substrate, causing local precursor breakdown and local CVD growth in the direction of the temperature gradient, typically along the axis of the laser beam. Material will deposit and a fiber will grow, and if the fiber is withdrawn at the growth rate, the hot spot will remain largely stationary and the process can continue indefinitely, resulting in an arbitrarily long CVD-produced fiber.

Figure 2:
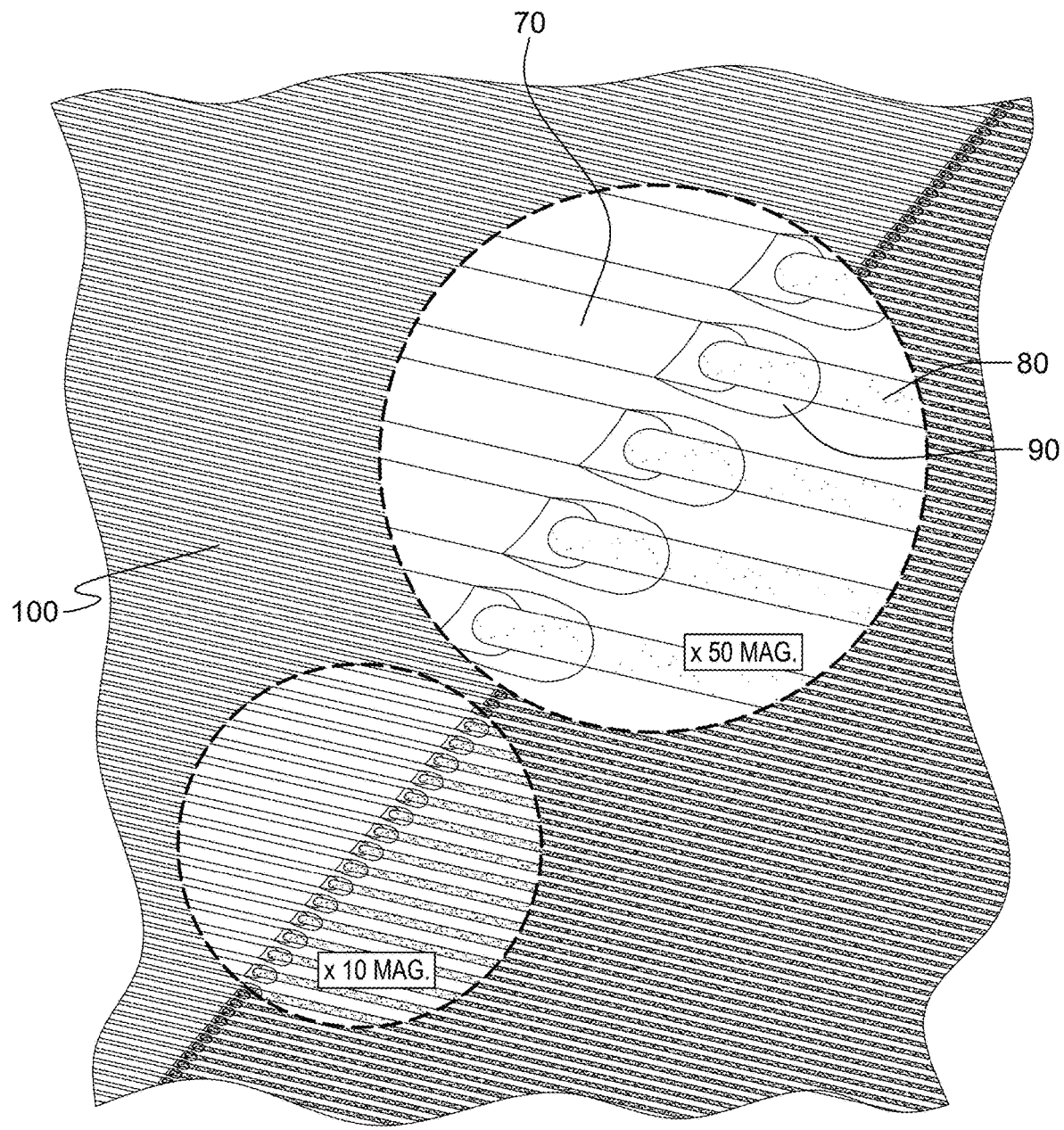
FIG. 2 is a schematic view showing how LCVD can be massively parallelized by a multiplication of the laser beams, in accordance with one or more aspects of the present invention.
Figure 3:
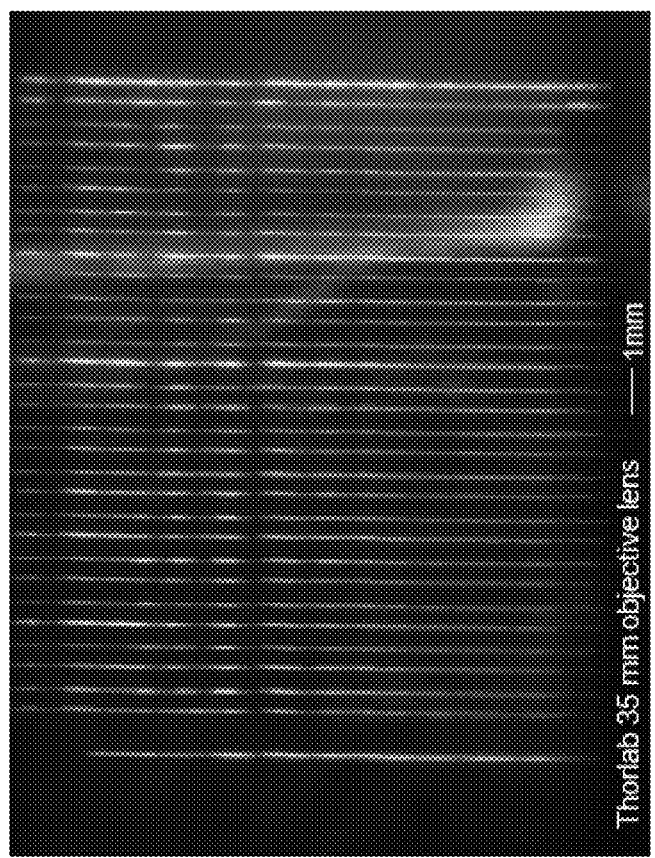
FIG. 3 depicts an example of parallel LCVD growth of carbon fibers, in accordance with one or more aspects of the present invention.
Figure 3:
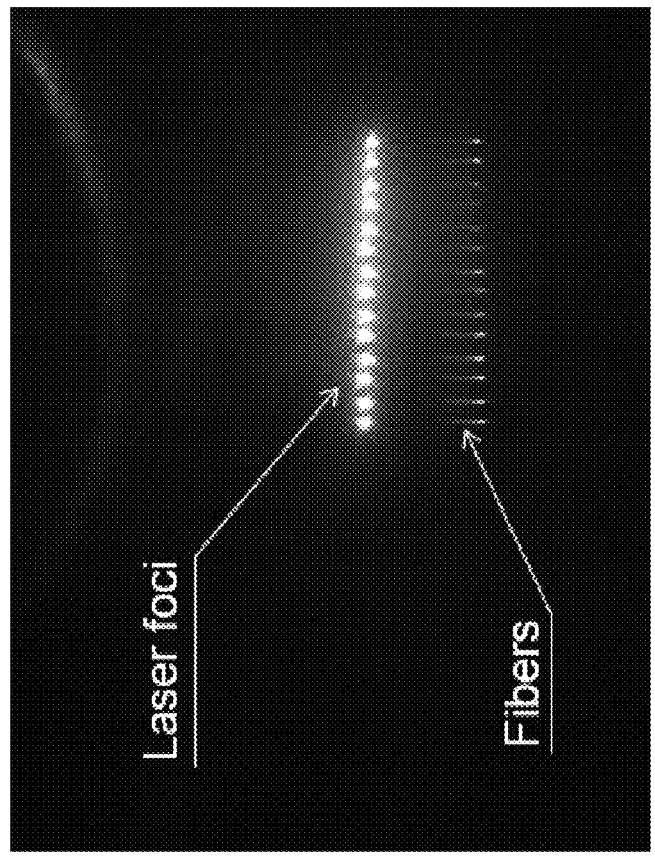

Also in accordance with that Application, a large array of independently controlled lasers can be provided, growing an equally large array of fibers 70 in parallel, as illustrated in FIG. 2, showing how fiber LCVD can be massively parallelized from a filament lattice 100 by multiplication of the laser beams 80 inducing a plasma 90 around the tip of each fiber 70. Using a Computer to Plate (CtP) (e.g., Quantum Well Intermixing (QWI)) laser array for LCVD is a scientific first, and so was the use of a shallow depth of focus. It provides very beneficial results. Sample carbon fibers, such as those shown in FIG. 3, were grown in parallel. FIG. 3 shows parallel LCVD growth of carbon fibers—Left: Fibers during growth and Right: Resulting free standing fibers 10-12 μm in diameter and about 5 mm long.

Figure 4A:
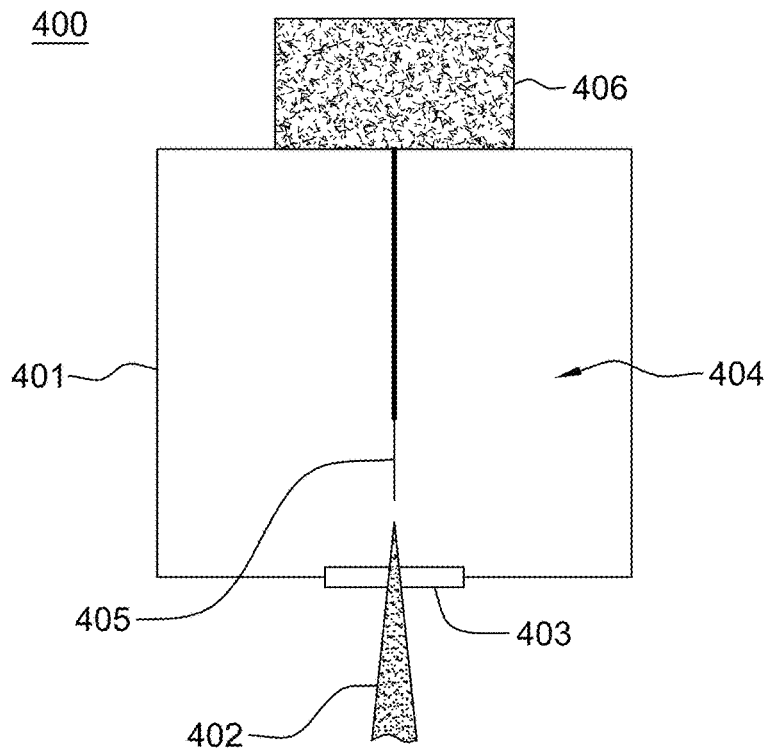
FIG. 4A is a simplified schematic of components of an LCVD system facilitating fabrication of a multi-composition fiber with elemental additive(s), in accordance with one or more aspects of the present invention.

As discussed herein, laser-driven, chemical-vapor-deposition (LCVD) technology is capable of forming high-performance ceramic and inorganic fibers for composite material systems. FIG. 1 discussed above is a schematic representation of a monofilament LCVD production process. FIG. 4A is a simplified view of an LCVD production system for producing a multi-composition fiber with one or more elemental additives, in accordance with one or more aspects of the present invention, and FIG. 4B depicts an exemplary process for producing a multi-composition fiber with one or more elemental additives, in accordance with one or more aspects of the present invention.

Referring to FIG. 4A, the LCVD system 400 shown includes a chamber 401 into which one or more lasers 402 are directed through one or more windows 403. Chamber 401 includes precursor gases 404 for facilitating producing a fiber 405 such as disclosed herein. A fiber extraction apparatus 406 facilitates withdrawing the fiber as it is produced within the chamber.

Figure 4B:
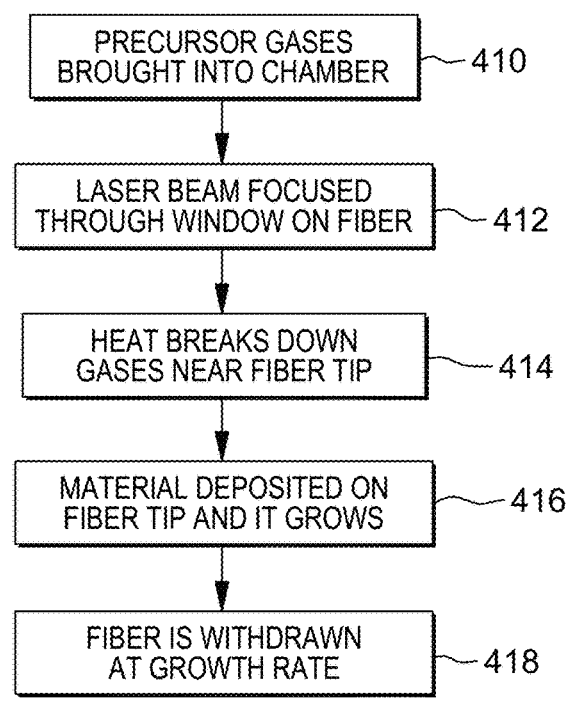
FIG. 4B depicts one embodiment of a process for fabricating a multi-composition fiber with elemental additive(s), in accordance with one or more aspects of the present invention.

The deposition process may include bringing precursor gases into the chamber 410, as illustrated in FIG. 4B. For a given fabrication process, ratios of the precursor gases are selected and introduced into the chamber. The gases contain the atomic species that are to be deposited in the fiber format. For instance, silicon carbide fibers (SiC) may be formed from silicon-containing and carbon-containing gases, or a single gas that contains both atoms. In addition, a small laser beam is directed into the gas-containing chamber through a window that transmits the laser wavelength 412. This laser beam is focused onto an initiation site, which can be a fiber seed, a thin substrate, or any other solid component that will heat up upon being intersected by the beam and absorb its energy. At this hot spot 414, the precursor gases disassociate and, through certain chemical reaction steps, deposit a desired solid product. For instance, in the example above, the solid SiC deposit accreting together form the fiber 416. The fiber itself grows towards the laser source, and thus the fiber is pulled away and out of the reactor at an equivalent fiber growth rate 418. In this manner, the deposition zone remains at a constant physical position (the focal point of the laser beam), and deposition can continue indefinitely, as long as the laser beam is on and the supply of precursor gases is replenished.

As noted above, FIG. 2 provides a representation of a massive parallelization of the laser beam input, increased from a single beam to a multitude of individually controlled laser beams, to produce high-quality volume array of parallel fibers.

By control of the localized chemistry formed in LCVD-produced fibers, multiple materials may be deposited simultaneously and homogeneously throughout the fiber microstructure. This approach can produce an inorganic, multiple material composite fiber by the LCVD process, which is composed of several desired chemistries. The localized chemistry is driven through controlled composition of the gas precursor feed. The addition of elemental atoms to the grain boundaries between the formed crystallites may require the gas precursor for that desired element to be less than approximately 5% atomic of the overall input gas composition.

Figure 5:
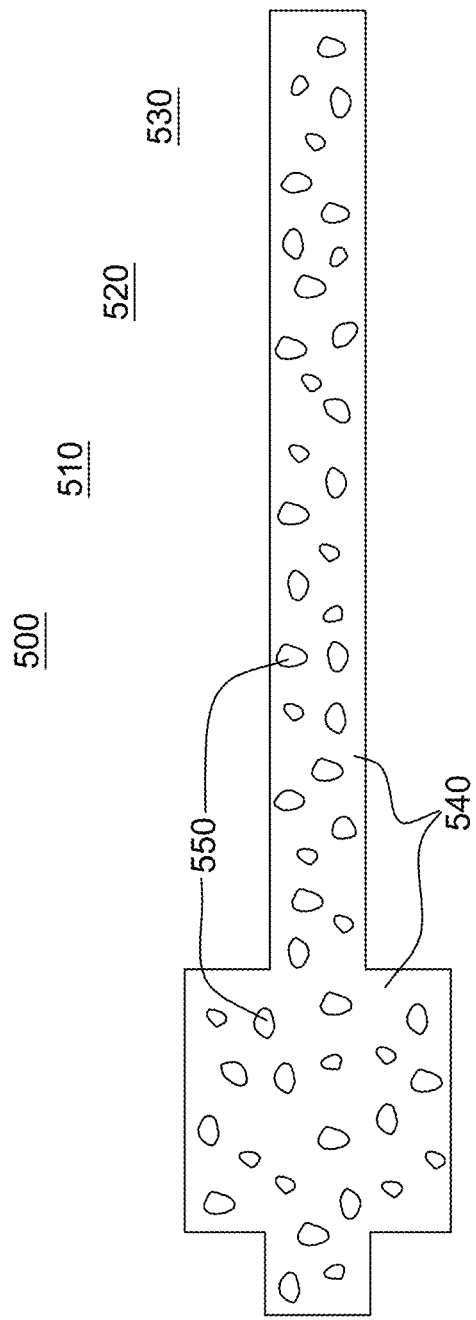
FIG. 5 depicts a partial embodiment of a multi-composition fiber with elemental additive(s), in accordance with one or more aspects of the present invention.

In accordance with one embodiment of the present invention, FIG. 5 illustrates a high-level depiction of a multi-composition fiber 500 comprising a primary fiber material 540 and an elemental additive material 550 deposited on grain boundaries between adjacent crystalline domains of primary fiber material 540.

In a more detailed embodiment, primary fiber material 540 is a refractory-grade, inorganic primary fiber material, which may include, but not be limited to, compositions such as silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and combinations thereof.

In another more detailed embodiment, elemental additive material 550 is selected from a group consisting of hafnium, tantalum, niobium, yttrium, lanthanum, cerium, zirconium, molybdenum, tungsten, and combinations thereof.

In another more detailed embodiment, multi-composition fiber 500 has a substantially non-uniform diameter. For instance, user-directed inputs for the LCVD process growth parameters, such as input laser power and precursor gas characteristics, provide exquisite control over the final formed fiber chemical and physical properties. For instance, these growth parameters can be altered to impart variations in the fiber diameter dimension. In effect, the fiber diameter may be changed from a thinner-to-thicker-to-thinner section (or vice versa), which can be repeated in a desired periodicity or designed in some manner to impart desired physical properties for the fibers in the overall composite performance.

In another aspect of the present invention, a method of making a multi-composition fiber 500 comprises providing a precursor laden environment 510 and promoting fiber growth using laser heating. Precursor laden environment 510 comprises a primary precursor material 520 and an elemental precursor material 530.

In a more detailed embodiment, primary precursor material 520 comprises a precursor for a material selected from a group which may include, but not be limited to, compositions such as silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and combinations thereof.

In another more detailed embodiment, elemental precursor material 550 comprises a precursor for a material selected from a group consisting of hafnium, tantalum, niobium, yttrium, lanthanum, cerium, zirconium, molybdenum, tungsten, and combinations thereof.

In another more detailed embodiment, precursor laden environment 510 comprises a material selected from a group consisting of gases, liquids, critical fluids, supercritical fluids, and combinations thereof.

In another alternative embodiment, the act of promoting fiber growth using laser heating comprises modulating the laser heating such that the multi-composition fiber 500 has a substantially non-uniform diameter.

Figure 6A:
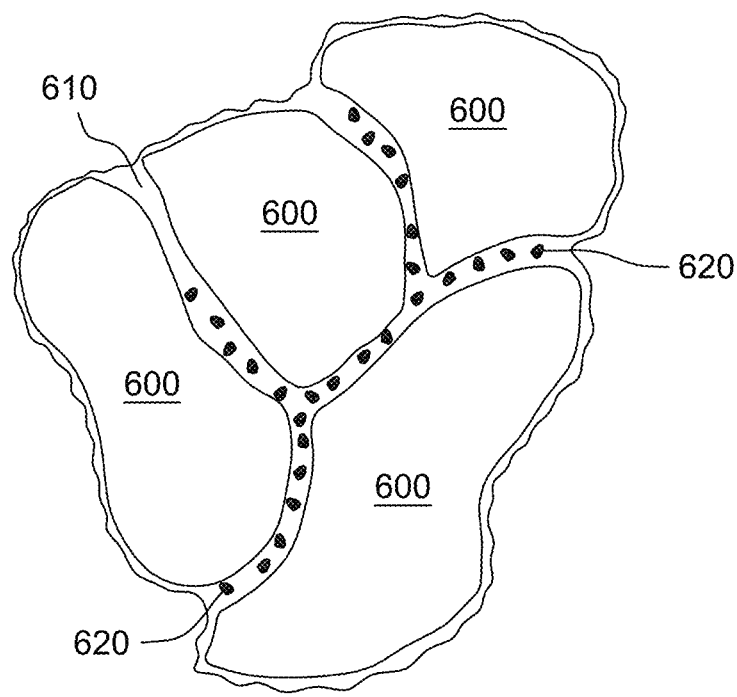
FIG. 6A is a partial cross-sectional view of a multi-composition fiber with elemental additive(s) at the grain boundaries, in accordance with one or more aspects of the present invention.

By way of further example, FIG. 6A shows an LCVD formed fiber, such as fiber 500 of FIG. 5, with preferential deposition of the desired elemental atoms 620 (FIG. 6A) at grain boundary locations 610 between the grains 600 of the primary fiber material. Advantageously, the elemental material is too large to fit within the grains themselves, for instance, within the crystalline structure of the grains, and thus, resides at the boundaries of the grains, as illustrated.

Figure 6B:
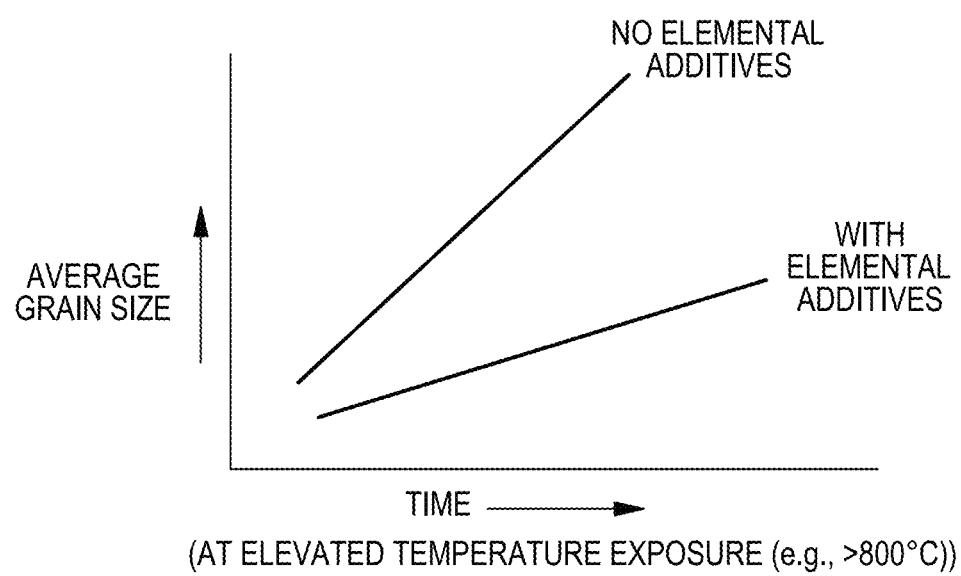
FIG. 6B graphically depicts impact on creep resistance with the addition of secondary elemental material at the grain boundary structures of a multi-composition fiber, in accordance with one or more aspects of the present invention.

FIG. 6B depicts the schematic relationship of the impact on creep resistance by the addition of elemental material, i.e., secondary elements, to the grain boundary structure of an inorganic material through the change in grain size versus exposure time at elevated temperatures (e.g., above 800° C.) as compared to an inorganic material that has no secondary element material additions at the grain boundaries.

Those skilled in the art will note from the above description that provided herein are multi-composition fibers and methods of fabrication. For instance, the multi-composition fiber may include a primary fiber material and an elemental additive material disposed on grain boundaries between adjacent crystalline domains of the primary fiber material. In one or more embodiments, the primary fiber material is a refractory-grade, inorganic primary fiber material. For instance, the primary fiber material may be a silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and combinations thereof. In one or more embodiments, the elemental additive material may be hafnium, tantalum, niobium, yttrium, lanthanum, cerium, zirconium, molybdenum, tungsten, and combinations thereof. Further, the multi-composition fiber may have a uniform, or a non-uniform, diameter. That is, in one or more implementations, the diameter of the multi-composition fiber may vary, as desired for a particular application.

In one or more implementations, the multi-composition fiber may include a primary fiber material and an elemental additive material deposited on grain boundaries between adjacent crystalline domains of the primary fiber material, where the primary fiber material is or includes one or more of: silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and/or combinations thereof, and the elemental additive material is one or more of hafnium, tantalum, niobium, yttrium, lanthanum, cerium, zirconium, molybdenum, tungsten, and/or combinations thereof. Further, the multi-composition fiber may have a uniform, or a substantially non-uniform diameter, as desired.

In one or more aspects, a method of making a multi-composition fiber is provided herein. The method includes providing a precursor laden environment; promoting fiber growth using laser heating; and wherein the precursor laden environment includes a primary precursor material and an elemental precursor material. In one or more implementations, the primary fiber material is a refractory-grade, inorganic primary fiber material. For instance, the primary fiber material may include a precursor for a material selected from a group consisting of: silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and/or combinations thereof. In one or more embodiments, the elemental precursor material may be a precursor for material selected from a group consisting of: hafnium, tantalum, niobium, yttrium, lanthanum, cerium, zirconium, molybdenum, tungsten, hafnium carbide, tantalum carbide, niobium carbide, tantalum diboride, zirconium diboride, tungsten diboride, hafnium nitride, tantalum nitride, zirconium nitride, and/or combinations thereof. In one or more implementations, the precursor laden environment may include a material selected from a group consisting of: gases, liquids, critical fluids, super-critical fluids, and combinations thereof. Further, promoting fiber growth using laser heating may include modulating the laser heating such that the multi-composition fiber has a substantially non-uniform diameter.

In one or more embodiments, disclosed herein is a method of making a multi-composition fiber which includes: providing a precursor laden environment, promoting fiber growth using laser heating; and wherein the precursor laden environment includes a primary precursor material and an elemental precursor material. The primary precursor material includes a precursor for a material selected from a group consisting of: silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and/or combinations thereof. The elemental precursor material includes a precursor for a material selected from a group consisting of: hafnium, tantalum, niobium, yttrium, lanthanum, cerium, zirconium, molybdenum, tungsten, and/or combinations thereof. In one or more embodiments, the precursor laden environment includes a material selected from a group consisting of gases, liquids, critical fluids, super-critical fluids, and combinations thereof. Further, promoting fiber growth using laser heating may include modulating the laser heating such that the multi-composition fiber has a substantially non-uniform diameter along its length.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A multi-composition fiber comprising a primary fiber material and an elemental additive material, said elemental additive material having too large an atom size to fit within a single crystalline domain within a crystalline structure of the fiber, and being deposited on grain boundaries between adjacent crystalline domains of the primary fiber material to present an energy barrier to atomic diffusion through the grain boundaries and to increase creep resistance by slowing down grain growth between the adjacent crystalline domains of the primary fiber material.

2. The multi-composition fiber of claim 1, wherein the primary fiber material is a refractory-grade, inorganic primary fiber material.

3. The multi-composition fiber of claim 1, wherein the primary fiber material is selected from a group consisting of silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and combinations thereof.

4. The multi-composition fiber of claim 1, wherein the elemental additive material is selected from a group consisting of hafnium, tantalum, niobium, yttrium, lanthanum, cerium, zirconium, molybdenum, tungsten, and combinations thereof.

5. The multi-composition fiber of claim 1, wherein the multi-composition fiber has a substantially non-uniform diameter.

6. A multi-composition fiber comprising a primary fiber material and an elemental additive material, said elemental additive material having too large an atom size to fit within a single crystalline domain within a crystalline structure of the fiber, and being deposited on grain boundaries between adjacent crystalline domains of the primary fiber material to present an energy barrier to atomic diffusion through the grain boundaries and to increase creep resistance by slowing down grain growth between the adjacent crystalline domains of the primary fiber material:
   the primary fiber material being selected from a group consisting of silicon carbide, boron carbide, silicon nitride, zirconium carbide, hafnium diboride, hafnium carbide, tantalum carbide, niobium carbide, tantalum diboride, zirconium diboride, tungsten diboride, hafnium nitride, tantalum nitride, zirconium nitride, and combinations thereof; and the elemental additive material being selected from a group consisting of hafnium, tantalum, niobium, yttrium, lanthanum, cerium, zirconium, molybdenum, tungsten, and combinations thereof.

7. The multi-composition fiber of claim 6, wherein the multi-composition fiber has a substantially non-uniform diameter.

* * * * *